United States Patent
Ocenasek et al.

(10) Patent No.: US 7,062,234 B2
(45) Date of Patent: Jun. 13, 2006

(54) PRE-DISTORTION CROSS-CANCELLATION FOR LINEARIZING POWER AMPLIFIERS

(75) Inventors: Josef Ocenasek, Whippany, NJ (US); James C. Giacobazzi, Bloomingdale, IL (US)

(73) Assignee: Andrew Corporation, Orland Park, IL (US)

( * ) Notice: Subject to any disclaimer, the term of this patent is extended or adjusted under 35 U.S.C. 154(b) by 379 days.

(21) Appl. No.: 10/628,263

(22) Filed: Jul. 28, 2003

(65) Prior Publication Data

US 2005/0026574 A1 Feb. 3, 2005

(51) Int. Cl.
*H04B 1/04* (2006.01)
*H04K 1/02* (2006.01)
*H04L 25/03* (2006.01)

(52) U.S. Cl. ............... 455/114.3; 455/63.1; 455/67.13; 375/297; 330/149

(58) Field of Classification Search ............. 455/114.2, 455/114.3, 127.1, 127.2, 127.3, 126, 63.1, 455/67.1, 67.13, 115.1; 375/295, 296, 297; 330/124 R, 126, 10, 75, 149, 278, 295
See application file for complete search history.

(56) References Cited

U.S. PATENT DOCUMENTS

| | | | | |
|---|---|---|---|---|
| 4,885,551 A | | 12/1989 | Myer | 330/52 |
| 4,943,783 A | | 7/1990 | Nojima | 330/149 |
| 5,675,285 A | | 10/1997 | Winters | 330/124 R |
| 5,770,971 A | * | 6/1998 | McNicol | 330/149 |
| 5,808,511 A | * | 9/1998 | Kobayashi | 330/149 |
| 5,892,397 A | * | 4/1999 | Belcher et al. | 330/149 |
| 5,898,338 A | | 4/1999 | Proctor et al. | 330/149 |
| 5,900,778 A | * | 5/1999 | Stonick et al. | 330/149 |
| 6,054,895 A | | 4/2000 | Danielsons et al. | 330/149 |
| 6,054,896 A | | 4/2000 | Wright et al. | 330/149 |
| 6,111,462 A | | 8/2000 | Mucenieks et al. | 330/149 |
| 6,133,790 A | | 10/2000 | Zhou | 330/149 |
| 6,232,836 B1 | | 5/2001 | Zhou | 330/149 |
| 6,266,517 B1 | * | 7/2001 | Fitzpatrick et al. | 455/114.3 |
| 6,268,768 B1 | | 7/2001 | Blodgett | 330/107 |
| 6,313,703 B1 | | 11/2001 | Wright et al. | 330/149 |
| 6,342,810 B1 | | 1/2002 | Wright et al. | 330/51 |
| 6,907,025 B1 | * | 6/2005 | Demir et al. | 370/342 |
| 6,934,341 B1 | * | 8/2005 | Sahlman | 375/297 |
| 2002/0101937 A1 | | 8/2002 | Antonio et al. | 375/297 |
| 2002/0171477 A1 | | 11/2002 | Nakayama et al. | 330/53 |
| 2003/0064738 A1 | | 4/2003 | Posner et al. | 445/503 |

* cited by examiner

*Primary Examiner*—Quochien B. Vuong
(74) *Attorney, Agent, or Firm*—Steve Mendelsohn

(57) ABSTRACT

In an amplifier system having two or more different amplifier sub-systems, the input signal to at least one of the amplifier sub-systems is pre-distorted based on the combined output signal from the two or more amplifier sub-systems. In one embodiment, each other amplifier sub-system pre-distorts its input signal based on only its own output signal. In one operational scenario, during initial operations, each amplifier sub-system separately pre-distorts its input signal based on only its own output signal. After pre-distortion has settled, one of the amplifier sub-systems is switched to pre-distort its input signal based on the combined output signal, while the other amplifier sub-systems continue to pre-distort their input single based on only their own output signals.

17 Claims, 3 Drawing Sheets

PRE-DISTORTION CROSS-CANCELLATION FOR LINEARIZING POWER AMPLIFIERS

FIELD OF THE INVENTION

The present invention relates to signal processing, and, in particular, to the pre-distortion of signals for transmission, for example, in a wireless communication network, to reduce spurious emissions.

BACKGROUND OF THE INVENTION

Modern wireless communication networks employ complex modulation schemes that necessitate tight control of spurious emissions (sometimes called "out-of-band emissions") in order to avoid interfering with neighboring carriers and to comply with the requirements of regulatory bodies (e.g., FCC) and standards bodies (e.g. ITU). One source of spurious emissions is the base station transmitter amplifier that is used to amplify signals prior to transmission as wireless (e.g., RF) signals to wireless (e.g., mobile) units in a wireless communication network, such as a cellular voice and/or data network. Prior art techniques for reducing such spurious emissions were able to satisfy previous requirements. However, recent developments in wireless communication networks (e.g., Universal Mobile Telecommunication Service (UMTS)) place additional burden on the base station transmitter amplifier and make it advantageous to reduce the spurious emissions even further.

BRIEF DESCRIPTION OF THE DRAWINGS

Aspects, features, and advantages of the present invention will become more fully apparent from the following detailed description, the appended claims, and the accompanying drawings in which like reference numerals identify similar or identical elements.

DETAILED DESCRIPTION

Embodiments of the present invention are directed to techniques that reduce spurious emissions in wireless communication networks to levels that satisfy current requirements. In the prior art, pre-distortion is performed for each amplifier independently. That is, each amplifier has its own pre-distortion and each pre-distortion looks at only the output of its own amplifier. Embodiments of the present invention, on the other hand, involve pre-distortion for at least one amplifier that is based on the combined outputs from two or more different amplifiers. In one embodiment having two amplifiers, pre-distortion for one of the amplifiers is based on the combined output from both amplifiers. In a preferred implementation, pre-distortion for the other amplifier is based only on its own output. Performing pre-distortion for one amplifier based on the combined output signals from multiple amplifiers is referred to herein as pre-distortion cross-cancellation.

Figure 1:
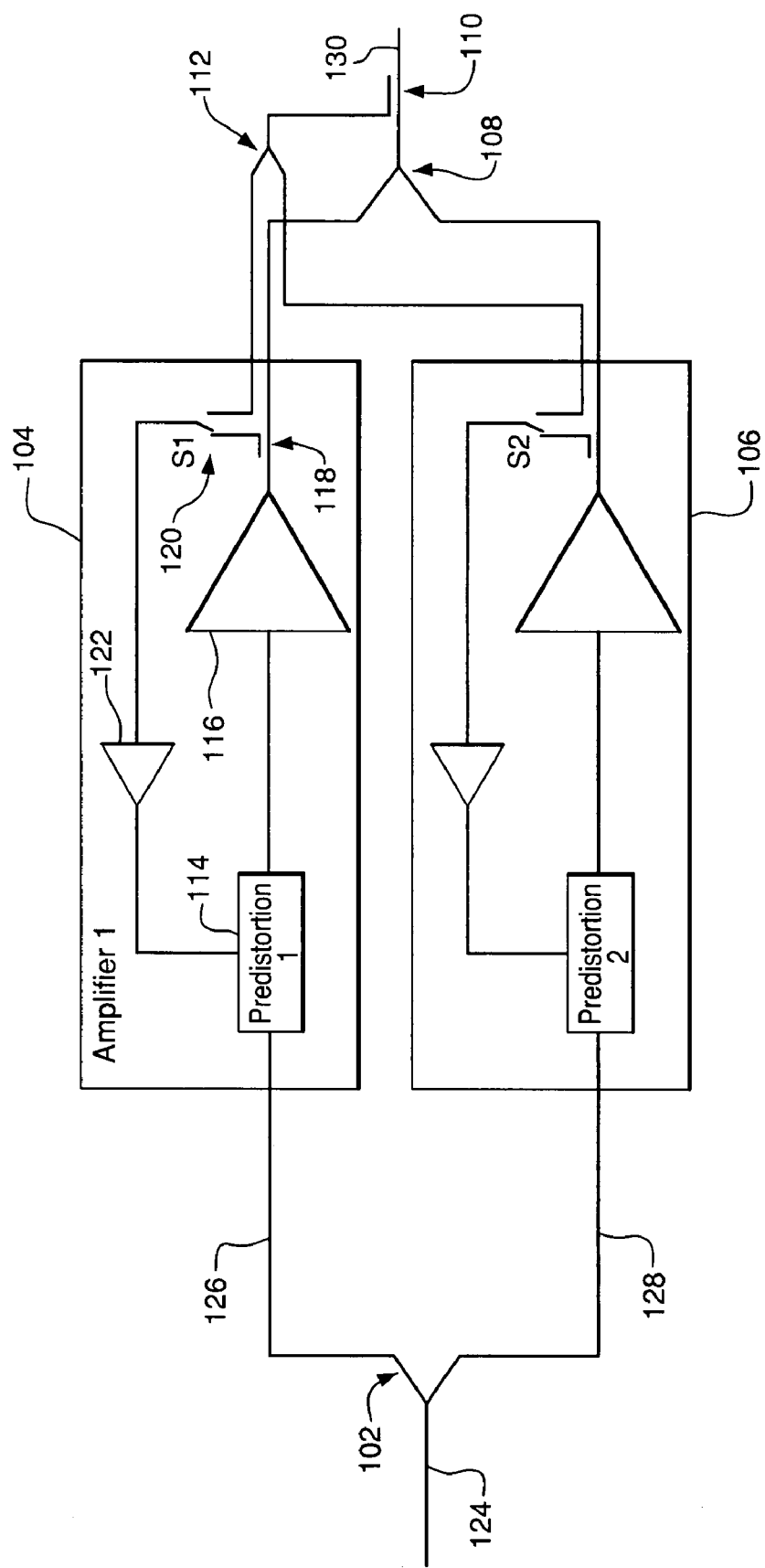
FIG. 1 shows a block diagram of an amplifier system according to one embodiment of the present invention.

FIG. 1 shows a block diagram of an amplifier system 100, according to one embodiment of the present invention. Amplifier system 100 comprises a first splitter 102, two amplifier sub-systems 104 and 106, a combiner 108, a tap 110, and a second splitter 112. Each amplifier sub-system comprises a pre-distortion block 114, a power amplifier 116, a tap 118, a switch 120, and a pre-distortion feed-back amplifier 122. For ease of notation, switch 120 of amplifier sub-system 104 is also referred to as switch S1, while switch 120 of amplifier sub-system 106 is also referred to as switch S2.

In operation, splitter 102 splits an input signal 124 into two copies: one copy 126 applied to amplifier sub-system 104 and the other copy 128 applied to amplifier sub-system 106. Within each amplifier sub-system, the corresponding input signal copy is pre-distorted by pre-distortion block 114 and amplified by power amplifier 116. The purpose of the pre-distortion is to compensate for distortion introduced during the power amplification to linearize the overall operations of the amplifier system. As will be appreciated by those skilled in the art, there are many different possible implementations of pre-distortion processing. The present invention can be implemented with any suitable pre-distortion processing.

A portion of each amplified signal is tapped by tap 118 and the rest of the two amplified signals from the two amplifier sub-systems are combined at combiner 108. A portion of the combined amplified signal is tapped by tap 110 and the remainder is presented as the amplified output signal 130.

The portion of the combined amplified signal tapped by tap 110 is split by splitter 112 into two copies: one copy applied to switch S1 of amplifier sub-system 104 and the other copy applied to switch S2 of amplifier sub-system 106. Depending on the states of switches S1 and S2, within each sub-system, either the signal from the corresponding tap 118 or the corresponding signal from splitter 112 is applied to pre-distortion feed-back amplifier 122, which provides the corresponding feed-back signal to pre-distortion block 114, which performs pre-distortion for the copy of the input signal applied to that amplifier sub-system. In a preferred implementation, switches S1 and S2 are independently controllable.

In one operational scenario, during initial operations, both switches S1 and S2 are controlled to select the signals from their corresponding taps 118. With this configuration, pre-distortion for each amplifier sub-system is based only on its own output signal. After this independent pre-distortion processing has settled to a suitable level, the state of one of the switches (e.g., S1) is changed to select the portion of the combined amplified signal from splitter 112. At this point, pre-distortion of that amplifier sub-system (e.g., 104) is based on the combined outputs from both sub-systems, while pre-distortion of the other sub-system (e.g., 106) continues to be based only on its own output signal. It is not necessary for each amplifier subsystem to first operate independently, but doing so will speed up the convergence of the combined amplifiers.

Figure 2:
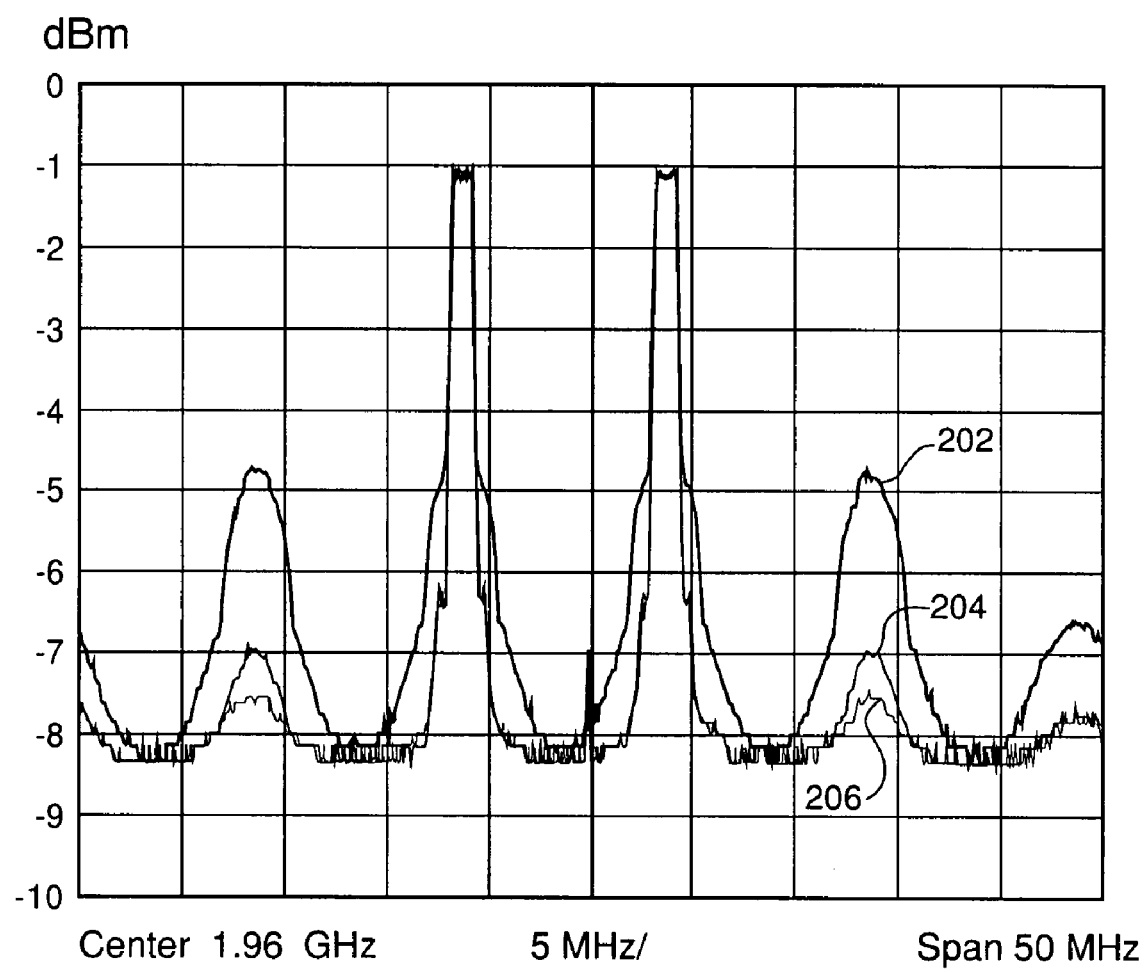
FIG. 2 shows a graph representing intermodulation distortion results for an operational scenario in which pre-distortion is initially performed separately for both amplifier sub-systems of FIG. 1 and then switched to pre-distortion cross-cancellation in which pre-distortion for one of the sub-systems is based on the combined output from both sub-systems, while the other sub-system continues to perform pre-distortion based only on its own output.

FIG. 2 shows a graph representing intermodulation distortion results for this operational scenario in which pre-distortion is initially performed separately for both amplifier sub-systems and then switched to pre-distortion cross-cancellation in which pre-distortion for one of the sub-systems is based on the combined output from both sub-systems, while the other sub-system continues to perform pre-distortion based only on its own output. In particular, curve 202 of FIG. 2 represents intermodulation distortion with no pre-distortion processing, curve 204 represents intermodulation distortion when each amplifier sub-system performs separate pre-distortion, and curve 206 represents intermodulation distortion with this type of pre-distortion cross-cancellation. While curve 204 shows over 20 dB cancellation of intermodulation distortion relative to curve 202, curve 206 shows an additional 4–5 dB improvement over curve 204.

Another type of pre-distortion cross-cancellation involves one amplifier sub-system performing the pre-distortion for all of the sub-systems. For the embodiment shown in FIG. 1, this type of pre-distortion cross-cancellation can be implemented by setting switch S1 to select the combined feedback signal from splitter 112, while turning off pre-distortion block 114 of amplifier sub-system 106.

Figure 3:
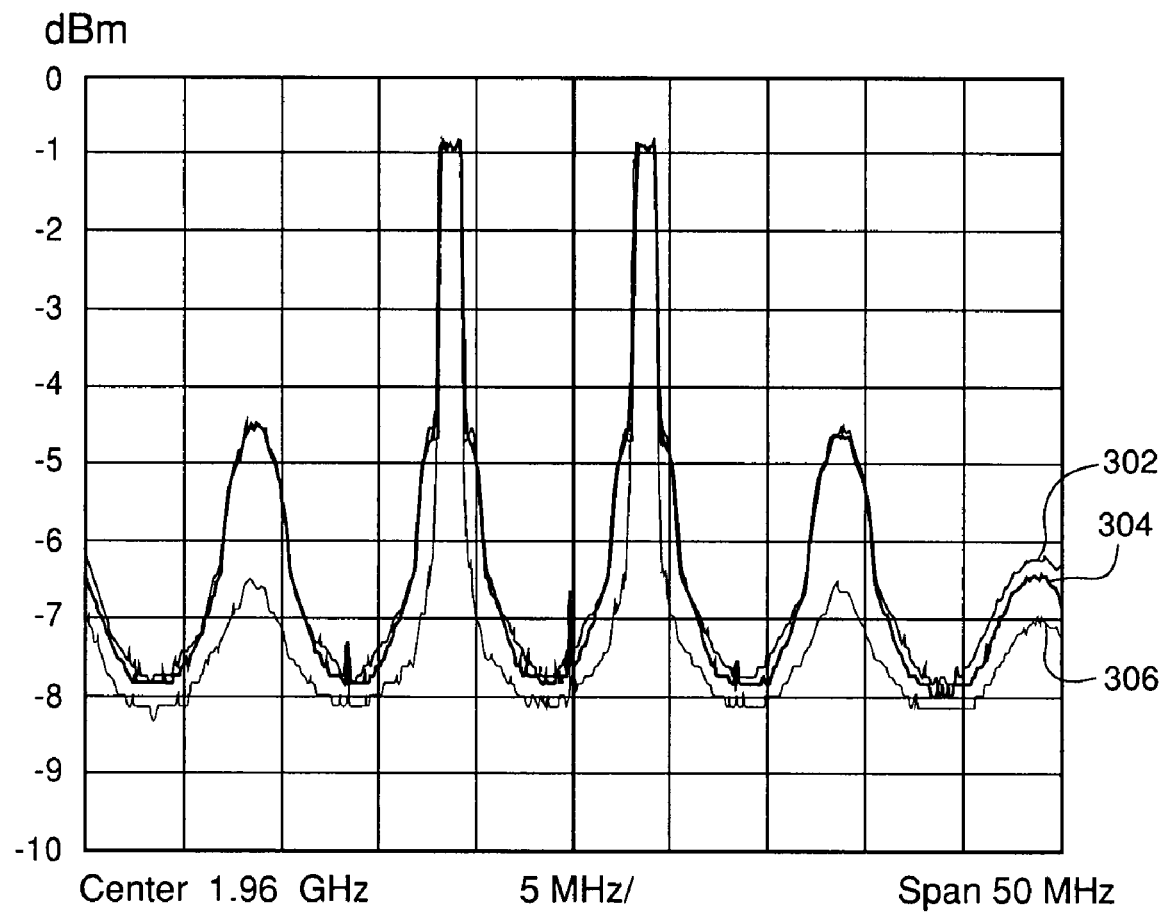
FIG. 3 shows a graph representing intermodulation distortion results for a pre-distortion cross-cancellation scenario in which one amplifier sub-system performs the pre-distortion for both sub-systems of FIG. 1, while the other amplifier sub-system performs no pre-distortion.

FIG. 3 shows a graph representing intermodulation distortion results for this pre-distortion cross-cancellation scenario in which one amplifier sub-system (e.g., 104) performs the pre-distortion for both sub-systems 104 and 106, while the other amplifier sub-system (e.g., 106) performs no pre-distortion. In particular, curves 302 and 304 represent intermodulation distortion for the two sub-systems with no pre-distortion processing, while curve 306 represents intermodulation distortion with this type of pre-distortion cross-cancellation. Curve 306 shows about 20 dB cancellation of intermodulation distortion relative to curves 302 and 304.

Other operational scenarios are also possible. For example, pre-distortion cross-cancellation could involve both amplifier sub-systems performing pre-distortion based on the combined output. Depending on the implementation, this type of pre-distortion cross-cancellation could be applied initially, after both sub-systems are pre-distorted separately, or after one of the sub-systems has been switched to pre-distortion cross-cancellation. Those skilled in the art will understand that pre-distortion processing for amplifier system 100 may involve a variety of different operational scenarios by controlling the states of switches S1 and S2 and by individually turning on and off pre-distortion blocks 114 of sub-systems 104 and 106. It will also be understood that the present invention can be implemented with three or more different amplifier sub-systems, with appropriate taps, splitters, and switches to provide any desirable configurations of pre-distortion cross-cancellation in which each of one or more different sub-systems performs pre-distortion based on the combined outputs from two or more different sub-systems.

Pre-distortion cross-cancellation can provide a level of redundancy to an amplifier system. When one amplifier provides pre-distortion for itself and one or more other amplifiers, if that pre-distortion should happen to fail, it may be able to be compensated for by pre-distortion provided by one of the other amplifiers.

Although the present invention has been described in the context of wireless signals transmitted from a base station to one or more mobile units of a wireless communication network, the present invention is not so limited. In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

What is claimed is:

1. A method for reducing spurious emissions in an amplified signal, the method comprising the steps of:
   (a) amplifying a first copy of an input signal by a first amplifier sub-system;
   (b) amplifying one or more other copies of the input signal by one or more other amplifier sub-systems;
   (c) combining outputs from the first amplifier sub-system and the one or more other amplifier sub-systems to generate a combined amplified output signal, wherein the first amplifier sub-system:
      (1) applies pre-distortion to the first copy of the input signal to generate a pre-distorted first copy of the input signal, wherein the pre-distortion of the first copy of the input signal is based on the combined amplified output signal; and
      (2) amplifies the pre-distorted first copy of the input signal to generate the output from the first amplifier sub-system.

2. The invention of claim 1, wherein a portion of the combined amplified output signal is tapped off and fed back to the first amplifier sub-system for use in pre-distorting the first copy of the input signal.

3. The invention of claim 1, wherein each other amplifier sub-system:
   (1) applies pre-distortion to its copy of the input signal to generate a pre-distorted copy of the input signal, wherein the pre-distortion of its copy of the input signal is based on only the output from said each other amplifier sub-system; and (2) amplifies the pre-distorted copy of the input signal to generate the output from said each other amplifier sub-system.

4. The invention of claim 1, wherein each other amplifier sub-system amplifies its copy of the input signal without performing any pre-distortion.

5. The invention of claim 1, wherein:
during initial operations, each amplifier sub-system pre-distorts its copy of the input signal based on only the output from said each amplifier sub-system; and
after the initial operations, the first sub-system pre-distorts its copy of the input signal based on the combined amplified output signal.

6. The invention of claim 1, further comprising performing pre-distortion by one of the one or more other amplifier sub-systems based on the combined amplified output signal in case of failure of the pre-distortion processing of the first amplifier sub-system.

7. The invention of claim 1, wherein step (c) comprises summing the outputs from the first amplifier sub-system and the one or more other amplifier sub-systems to generate the combined amplified output signal.

8. An apparatus comprising:
a first amplifier sub-system adapted to amplify a first copy of an input signal;
one or more other amplifier sub-systems adapted to amplify one or more other copies of the input signal;
a combiner adapted to combine outputs from the first amplifier sub-system and the one or more other amplifier sub-systems to generate a combined amplified output signal, wherein the first amplifier sub-system comprises:
(1) a pre-distortion block adapted to apply pre-distortion to the first copy of the input signal to generate a pre-distorted first copy of the input signal, wherein the pre-distortion of the first copy of the input signal is based on the combined amplified output signal; and
(2) a power amplifier adapted to amplify the pre-distorted first copy of the input signal to generate the output from the first amplifier sub-system.

9. The invention of claim 8, wherein a portion of the combined amplified output signal is tapped off and fed back to the first amplifier sub-system for use in pre-distorting the first copy of the input signal.

10. The invention of claim 8, wherein each other amplifier sub-system comprises:
(1) a pre-distortion block adapted to apply pre-distortion to its copy of the input signal to generate a pre-distorted copy of the input signal, wherein the pre-distortion of its copy of the input signal is based on only the output from said each other amplifier sub-system; and
(2) a power amplifier adapted to amplify the pre-distorted copy of the input signal to generate the output from said each other amplifier sub-system.

11. The invention of claim 8, wherein each other amplifier sub-system is adapted to amplify its copy of the input signal without performing any pre-distortion.

12. The invention of claim 8, wherein:
during initial operations, each amplifier sub-system is adapted to pre-distort its copy of the input signal based on only the output from said each amplifier sub-system; and
after the initial operations, the first sub-system is adapted to pre-distort its copy of the input signal based on the combined amplified output signal.

13. The invention of claim 8, wherein:
the one or more other amplifier sub-systems comprise a second amplifier sub-system adapted to amplify a second copy of the input signal; and
the combiner is adapted to combine the outputs from the first and second amplifier sub-systems to generate the combined amplified output signal.

14. The invention of claim 13, further comprising:
a first splitter adapted to split the input signal into the first and second copies of the input signal;
a first tap adapted to tap off a portion of the combined amplified output signal; and
a second splitter adapted to split the portion of the combined amplified output signal into two copies, wherein each copy of the portion of the combined amplified output signal is fed back to a different one of the first and second amplifier sub-systems.

15. The invention of claim 14, wherein each amplifier sub-system further comprises a switch adapted to select either the corresponding copy of the portion of the combined amplified output signal or the output from said each amplifier sub-system for use in pre-distorting its copy of the input signal.

16. The invention of claim 8, wherein at least one of the one or more other amplifier sub-systems is adapted to perform pre-distortion based on the combined amplified output signal to provide a level of redundancy in case of failure of the pre-distortion processing of the first amplifier sub-system.

17. The invention of claim 8, wherein the combiner is adapted to sum the outputs from the first amplifier sub-system and the one or more other amplifier sub-systems to generate the combined amplified output signal.

* * * * *